United States Patent [19]

Takanashi

[11] Patent Number: 4,982,261

[45] Date of Patent: Jan. 1, 1991

[54] SEMICONDUCTOR DEVICE

[75] Inventor: Ken Takanashi, Itami, Japan

[73] Assignee: Mitsubishi Denki Kabushiki Kaisha, Tokyo, Japan

[21] Appl. No.: 172,271

[22] Filed: Mar. 23, 1988

[30] Foreign Application Priority Data

Apr. 27, 1987 [JP] Japan .................. 62-104984

[51] Int. Cl.$^5$ .................. H01L 29/74
[52] U.S. Cl. .................. 357/38; 357/39
[58] Field of Search .................. 357/39, 38

[56] References Cited

U.S. PATENT DOCUMENTS

| | | | |
|---|---|---|---|
| 3,896,477 | 7/1975 | Hutson | 357/39 |
| 4,357,621 | 11/1982 | Takeuchi et al. | 357/39 |
| 4,402,001 | 3/1983 | Momma et al. | 357/38 |

FOREIGN PATENT DOCUMENTS

| | | | |
|---|---|---|---|
| 568876 | 1/1981 | Japan | 357/39 P |
| 58201359 | 11/1983 | Japan | 357/39 |

Primary Examiner—Rolf Hille
Assistant Examiner—Steven Loke
Attorney, Agent, or Firm—Oblon, Spivak, McClelland, Maier & Neustadt

[57] ABSTRACT

Respective side ends (20s, 1s) of a $T_1$ electrode (20) and a gate electrode (1) of a TRIAC (70) are mutually adjacent and located on a $P_1$ layer (13). The side ends (20s, 1s) are connected electrically by a resistance area (13a) which is made of the same material as a semiconductor material used to make the $P_1$ layer (13). A gate current branches into first and second branch currents ($I_{GT1}$, $I_{GT2}$). Because the second branch current does not contribute to the turn on of the TRIAC, undesirable (dv/dt) turn on is prevented.

4 Claims, 4 Drawing Sheets

SEMICONDUCTOR DEVICE

BACKGROUND OF THE INVENTION

1. Field of the Invention

The present invention relates to a semiconductor device which has a pnpn junction, and more particularly, it relates to a semiconductor in which a resistor region made of a semiconductor material is inserted between a main electrode and a control electrode.

2. Description of the Prior Art

A cross sectional view of a conventional TRIAC (triode AC switch) is shown in FIG. 1. A TRIAC 50 comprises a semiconductor chip 51 which has p-type semiconductor layers 13 and 15 and n-type semiconductor layers 11, 12, 14, 16 and 17. In the following description, the p-type semiconductor layers 13 and 15 are respectively called "$P_1$ layer" and "$P_2$ layer", and the n-type semiconductor layers 11, 12, 14, 16, and 17 are respectively called "$N_1$ layer", "$N_2$ layer", "$N_3$ layer" and "$N_4$ layer". The $N_1$ layer 11 and $N_2$ layer 12 are in the form of a well and are selectively formed in the $P_1$ layer 13. Respective exposed surfaces of the $N_1$ layer 11 and the $N_2$ layer 12 and the top surface of the $P_1$ layer 13 form the top surface of the semiconductor chip 51. On the top surface of the semiconductor chip 51, a first main electrode ($T_1$ electrode) 2 and a gate electrode (G electrode) 1 are provided. The first main electrode 2 is provided to extend over the exposed surface of $N_1$ layer 11 and an area 52 defined as a part of the top surface of the $P_1$ layer 12 which exists on the opposite side of $N_2$ layer with respect to the $N_1$ layer, while the gate electrode 1 is provided to extend over the exposed surface of $N_2$ layer and the top surface of the $P_1$ layer.

The $N_3$ layer 14 is provided on the bottom surface of $P_1$ layer 13, and $P_2$ layer 15 is provided on the bottom surface of the $N_3$ layer. The $N_4$ layer 16 and the $N_5$ layer 17 are selectively formed on both side ends of the bottom part of $P_2$ layer 15, respectively. A second main electrode ($T_2$ electrode) 3 is provided on the semiconductor chip 51 so as to contact the respective bottom surface of the $P_2$ layer 15, the $N_4$ layer 16 and the $N_5$ layer 17.

A pnpn junction structure is formed by serial contacts of the $P_2$ layer 15, the $N_3$ layer 14, the $P_1$ layer 13 and the $N_1$ layer 11. When a positive signal is given to the gate electrode 1 while a voltage is being applied across the $T_1$ electrode 2 and the $T_2$ electrode 3, a current $I_{GT1}$ shown by a broken arrow flows from the gate electrode 1 to the $T_1$ electrode 2 through the inside of the $P_1$ layer 13. The current $I_{GT1}$ causes a voltage drop due to a resistance in the $P_1$ layer 13 in lateral direction (horizontal direction of FIG. 1), thereby the electric potential of a portion of the $P_1$ layer existing directly below the $N_1$ layer 11 is increased. Consequently, a junction surface $J_2$ between the $P_1$ layer 13 and the $N_1$ layer 11 is forward biased and electrons are injected into the $N_3$ layer 14 from the $N_1$ layer 11 through the $P_1$ layer 13. By the injection of these electrons, a junction surface $J_1$ between the $N_3$ layer 14 and the $P_2$ layer 15 is forward biased and holes are injected from the $P_2$ layer 15 to the $N_3$ layer 14. As a result of this, a TRIAC current flows from the $T_2$ electrode to the $T_1$ electrode and the TRIAC 50 turns on. Because the structure of the TRIAC 50 shown in FIG. 1 is well-known, other operations of the conventional TRIAC 50 (such as turn off operation) would be obvious to those skilled in the art.

An example of a switching circuit including the triac 50 is shown in FIG. 2. When a switching signal is inputted between input terminals 31 and 32, a gate voltage is applied between $T_1$ electrode 2 and gate electrode 1 through a photo coupler 4 which has a photo emitter 4a and a photo sensor 4b. When a voltage is being applied between output terminals 33 and 34, the TRIAC 50 is turned on, thereby the TRIAC current flows between output terminals 33 and 34 through the operation as described above. The switching circuit shown in FIG. 2 is suitable for controlling the TRIAC 50 while electrically insulating the input terminals 31, 32 and the output terminals 33, 34.

When an external voltage which causes a sudden level change is applied between the output terminals 33 and 34, a displacement current is generated in the photo sensor 4b, which flows into the gate electrode 1. If the placement current which flows into the gate electrode 1 is large, the TRIAC 50 is turned on undesirably by this displacement current as a gate current. The phenomenon is well-known to those skilled in the art as a "(dv/dt) turn on", wherein the symbol v expresses the voltage to be applied between main electrodes 2 and 3 and the symbol t expresses the time.

In order to prevent the (dv/dt) turn on, an external resistor 6 which is given as an individual element is connected between the gate electrode 1 and the $T_1$ electrode 2, as shown in FIG. 3. In the switching circuit shown in FIG. 3, because a part of the displacement current generated in the photo sensor 4b is shunted to the external resistor 6, undesirable (dv/dt) turn on is prevented even if the value of (dv/dt) is increased to some extent. Consequently, (dv/dt) turn on resistance of the TRIAC increases.

However, in the technique shown in FIG. 3, the external resistor 6 must be connected to and TRIAC 50, and therefore, the size and price of the semiconductor device in which the switching circuit of FIG. 3 is incorporated would increase.

Another example of the conventional thyristor is shown in FIG. 4. In the TRIAC 60 shown in FIG. 4, the $T_1$ electrode 2 is divided into two parts. In the $P_2$ layer, only the $N_4$ layer 16 of well-shape is formed selectively. The TRIAC 60 has a structure which is different from that of the TRIAC 50 of FIG. 1 but it is the same as the case of the TRIAC 50 in that the (dv/dt) turn on resistance is low. Consequently, the TRIAC 60 must also be connected to the external resistor 6 and used as the switching circuit shown in FIG. 3.

SUMMARY OF THE INVENTION

According to the present invention, a semiconductor device comprises: (a) a semiconductor chip having a plurality of semiconductor layers, in which mutual junction of the plurality of the semiconductor layers contains a pnpn junction, (b) a control electrode which is selectively provided on a first surface of the semiconductor chip, (c) a first main electrode which is provided on the first surface of the semiconductor chip, wherein one side of the first main electrode and one side end of the control electrode are mutually adjacent with a first area of the first surface of the semiconductor chip therebetween, the one side end of the first main electrode and the one side end of the control electrode exist on one semiconductor layer which is one of the plurality of the semiconductor layers, a surface part of the one semiconductor layer which is exposed in the first are is served as a resistance area made of a semiconductor material, and (d) a second main electrode which is provided on a second surface of the semiconductor chip.

According to a preferred embodiment of the present invention, the semiconductor device is a TRIAC or a thyristor having a pnpn junction, and the semiconductor chip comprises: (a-1) a first semiconductor layer having a first conductive type, (a-2) a second semiconductor layer having a second conductive type selectively provided in the first semiconductor layer, in which the second semiconductor layer is exposed on a second area of the first surface of the semiconductor chip, and the second area of the first semiconductor layer are contained in the first surface of the semiconductor chip, (a-3) a third semiconductor layer of a second conductive type which is provided on a second surface of the first semiconductor layer, and (a-4) a fourth semiconductor layer of the first conductive type which is provided on one surface of the third semiconductor layer. Said one semiconductor layer of the semiconductor chip is the first semiconductor layer. The control electrode is provided to contact the first semiconductor layer and the first main electrode is provided to extend over the first surface of the semiconductor layer and the second area. The second main electrode is provided to contact the fourth semiconductor layer, and the resistance area is a first part of the first semiconductor layer which is exposed on a part of the first surface of the first semiconductor layer.

According to the present invention, because the resistance area exists between the first main electrode and the control electrode, the (dv/dt) turn on resistance is improved without an external resistor.

Therefore, an object of the present invention is to improve (dv/dt) turn on resistance of a semiconductor device without an external resistor.

Another object of the present invention is to provide a semiconductor device which is capable of reducing the size and price of a semiconductor apparatus including such a semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
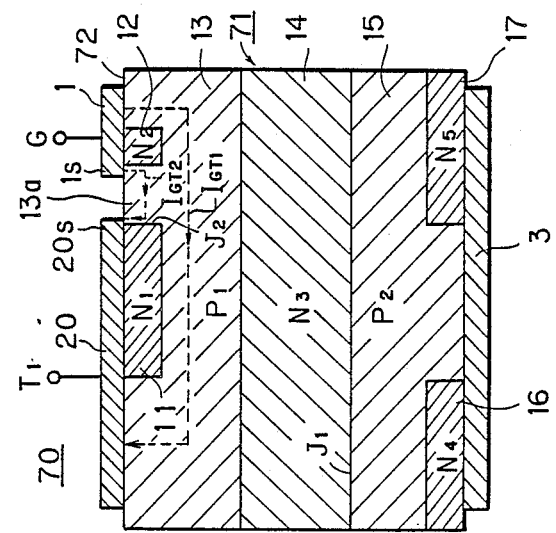
FIG. 5 is a cross sectional view of a TRIAC according to an embodiment of the present invention.
Figure 6:
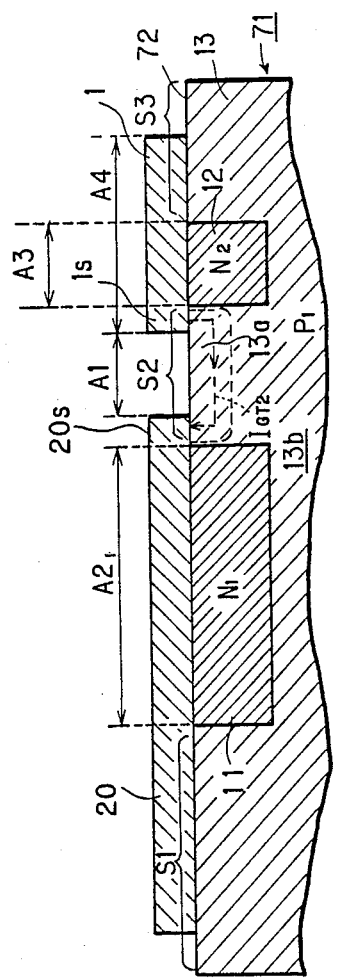
FIG. 6 is a partially enlarged view of FIG. 5.

FIG. 5 is a cross sectional view of a TRIAC 70 which is constructed according to an embodiment of the present invention, and FIG. 6 is a partially enlarged view of FIG. 5. In FIG. 5 and FIG. 6, the TRIAC 70 comprises a semiconductor chip 71 which has p-type semiconductor layers 13 and 15 and n-type semiconductor layers 11, 12, 14, 16 and 17. These semiconductor layers 11 through 17 are formed by doping n-type or p-type impurities into silicon substrate, for example. In the same manner as the conventional TRIAC 50 shown in FIG. 1, these p-type semiconductors layers 13 and 15 and n-type semiconductor layers 11, 12, 14, 16 and 17 will be referred to as $P_1$ layer, $P_2$ layer and $N_1$ layer to $N_5$ layers, respectively.

Figures 1, 4:
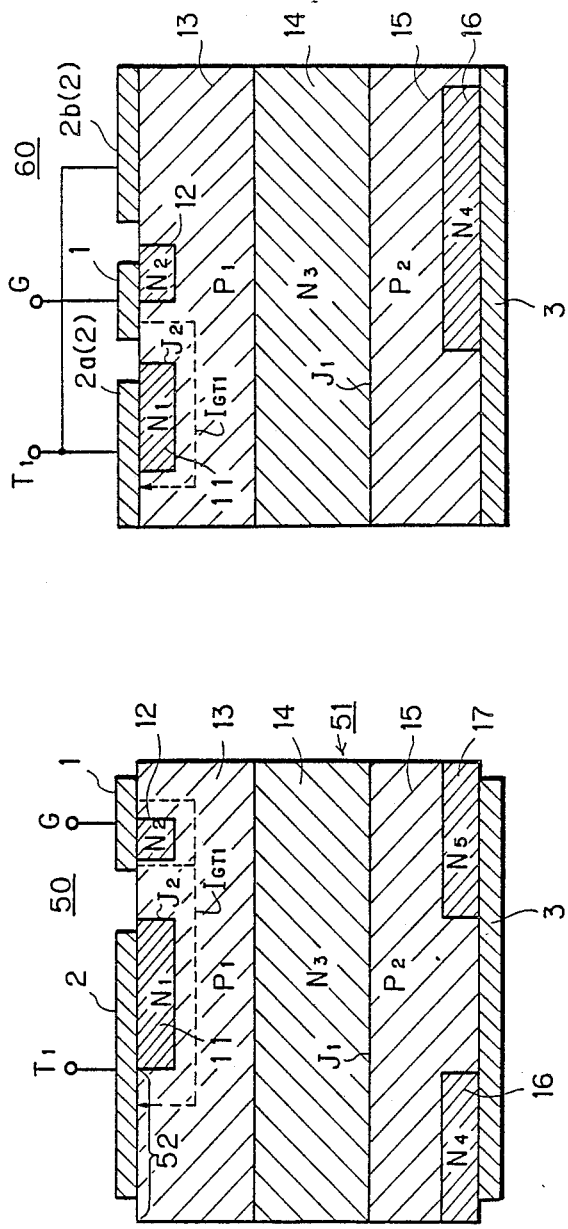
FIG. 1 is a cross sectional view of a conventional TRIAC.
FIG. 4 is a cross sectional view of another conventional TRIAC.

As is clearly understood by comparing FIG. 5 with FIG. 1, the mutual positional relation among each semiconductor layer 11 through 17 of the TRIAC 70 is the same as those in the conventional TRIAC 50. A major difference between TRIACs 50 and 70 is that one side end 20s of a $T_1$ electrode and one side end 1s of a gate electrode 1, which are adjacent to each other on the top surface 72 of a semiconductor chip 71, exist on the same semiconductor layer (the $P_1$ layer 13). In other words, the side ends 20s and 1s exist on the top surface of the semiconductor layer 13 which is included in a layer group consisting of the semiconductor layers 11 through 17. Side ends 20s and 1s are located with a first area A1 in the top surface 72 of the semiconductor chip 71 therebetween. In the conventional TRIAC 50, it should be noted that these side ends are respectively present on mutually different semiconductor layers 11 and 13, respectively. For the purpose of understanding such characteristic more clearly, the structure of the TRIAC 70 will be hereafter described in detail.

The $P_1$ layer 13, the $N_1$ layer 11, the $N_3$ layer 14, the $P_2$ layer 15 and the $N_2$ layer 12 are impurity semiconductors respectively and are called a first to a fifth semiconductor layers, respectively, in the present invention. In the $P_1$ layer 13, there are selectively formed the $N_1$ layer 11 and the $N_2$ layer 12. The $N_1$ layer 11 and the $N_2$ layer 12 are respectively exposed respectively to the outside of the semiconductor chip 71 in second and third areas A2, A3 (FIG. 6) in the top surface 72 of the semiconductor chip 71. In the cross sectional view shown in FIG. 6, the $P_1$ layer 13 has three first surfaces S1, S2 and S3 which are contained in the top surface 72 of the semiconductor chip 71. The first surfaces S1, S2 and S3 are composed by a first partial surface S1, a second partial surface S2, and a third partial surface S3. The first partial surface S1 exists on the outside (left hand side) of the second are A2 and the second partial surface S2 exists between the second and third areas A2 and A3. The third partial surface S3 exists on the outside (right hand side of the third area A3. The first surface 72 of the semiconductor chip 71 is composed by the areas A2 and A3 and the partial surfaces S1, S2 and S3.

Figure 9:
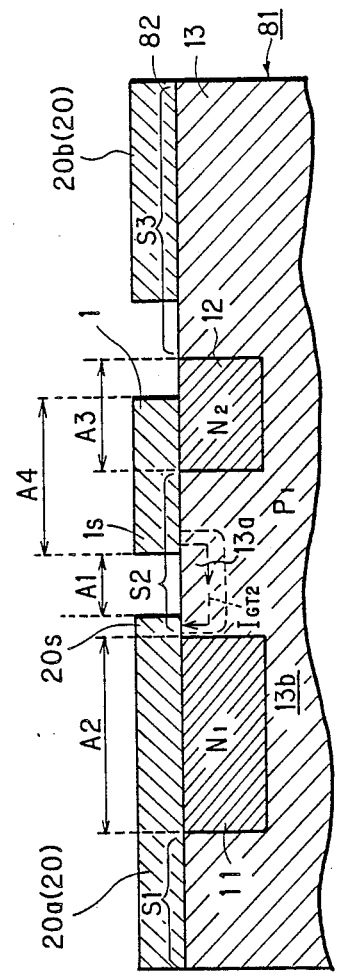
FIG. 9 is a partially enlarged view of FIG. 8.

The $T_1$ electrode 20 is provided to extend over the second area A2 and respective parts of the partial surfaces S1, S2. The side ends 20s exist on the partial surface S2. The gate electrode 1 is provided on a fourth area A4 in the first surface 72 of the semiconductor chip 71. The fourth are A4 contains the third area A3 and respective parts of the partial surfaces S2 and S3. As can be known from another embodiment (shown in FIG. 9) to be described later, the fourth area A4 may contain a part of the third area A3 and a part of the partial surface S2 only.

A surface part 13a of the $P_1$ layer 13 exposed in the first area A1 is a resistance area made of a semiconductor material identical to the semiconductor material of which $P_1$ layer 13 is made. The resistance area 13a is circled by broken lines in FIG. 6. The resistance area 13a may be merely a part of P₁ layer 13, or may be an area in which its impurity density is controlled by doping additional impurities from the partial surface S₂ into the P₁ layer selectively. When the impurity density in the resistance area 13a (the first part) is different from the impurity density in the remaining part (the second part) 13b of the P₁ layer 13, respective conductivities in the first and second part 13a and 13b becomes different from each other. If the n-type impurity is introduced from the second partial surface S2, the conductivity in the resistance area 13a lowers. The introduction of the n-type impurity is carried out so that the resistance area 13a does not lose the conductivity of p-type, and therefore, the resistance area 13a will have the conductivity of p-type as in the case of the second part 13b.

In FIG. 5, the N₃ layer 14 is provided on the bottom surface of P₁ layer 13. Furthermore, the P₂ layer 15 is provided on the bottom surface of N₃ layer 14. On the both end sides of the bottom of P₂ layer 15, the N₄ layer 16 and the N₅ layer 17 are respectively formed selectively. A T₂ electrode 3 is provided on the bottom surface of the semiconductor chip 71 which contains respective bottom surfaces f the P₂ layer 15, the N₄ layer 16 and the N₅ layer 17.

Figure 2:
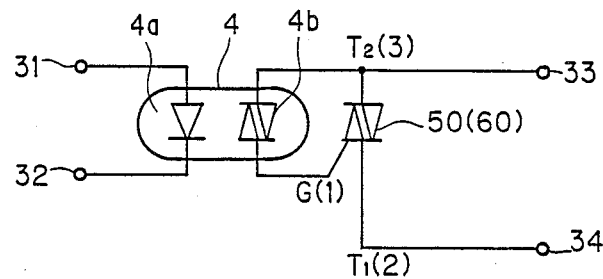
FIG. 2 and FIG. 3 are circuit diagrams of the switching circuits having a conventional TRIAC.
Figure 3:
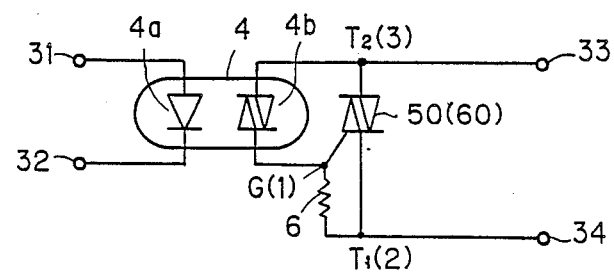
Figure 7:
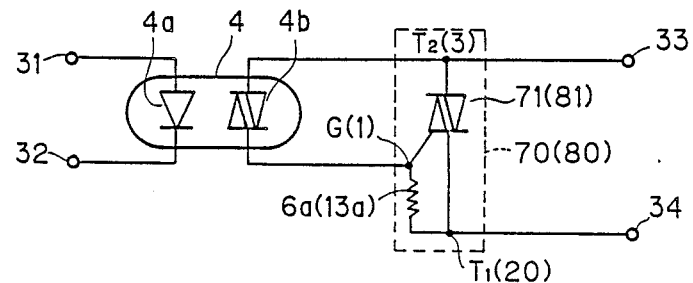
FIG. 7 is a circuit diagram of a switching circuit having the TRIAC shown in FIG. 5.

Since the side ends 20s and 1s are provided on the partial surface S2 of the P₁ layer 13 and the side ends 20s and 1s are electrically connected through the resistance area 13a, the TRIAC 70 incorporates a resistance given by the resistance area 13a. Therefore, when the TRIAC 70 is given in the switching circuit shown in FIG. 2, the equivalent circuit of this switching circuit is expressed as shown in FIG. 7. The resistor 6a is corresponding to the resistance area 13a and is internally interposed between the T₁ electrode 20 and the gate electrode 1.

When a voltage whose level sharply changes in a short period of time is applied externally between the output terminals 33 and 34, the displacement current from the photo sensor 4b flows toward the gate electrode 1. In FIG. 5, the displacement current is branched into a first branch current $I_{GT1}$ which flows through a part of P₁ layer 13 existing under the N₁ layer 20 to reach the T₁ electrode 20 and a second branch current $I_{GT2}$ which flows through the resistance area 13a to reach the T₁ electrode 20. The second branch current $I_{GT2}$ does not have a function to cause the TRIAC 70 to turn on. The value of the first branch current $I_{GT1}$ is smaller than the whole displacement current which flows into the gate electrode 1. Consequently, the value of the first branch current $I_{GT1}$ is smaller than the value which is necessary to turn on the TRIAC 70, and the TRIAC 70 does not be turned on by the displacement current. That is to say, the (dv/dt) turn on resistance is improved.

Because the resistor 6a is incorporated internally in the TRIAC 70 as the resistance area 13a, it is not necessary to connect an external resistor between the T₁ electrode 20 and the gate electrode 1. As a result, the space for installing an external resistor becomes unnecessary and thus the size and price of a semiconductor apparatus incorporated with the TRIAC 70 is reduced. The operation of the TRIAC 70 when a normal gate signal is given is as follows. Under the condition wherein an external voltage is applied between the T₁ electrode 20 and the T₂ electrode 3, a case is considered wherein a normal positive gate signal is given to the gate electrode 1. The first and second branch currents $I_{GT1}$, $I_{GT2}$ are caused to flow through the P₁ layer 13 toward the T₁ electrode 20. Different from the displacement current, the normal gate signal has a relatively large current value. Therefore, the value of the first branch current $I_{GT1}$ is smaller than the current value of the whole gate signal but has a sufficient value for forward biasing of the junction J₂ of the P₁ layer 13 and the N₁ layer 12. For this reason, electrons are injected from the N₁ layer 11 to the N₃ layer 14 through the P₁ layer 13 and positive holes are injected from the P₂ layer 15 to the N₃ layer 14. As a result, the TRIAC 70 turns on.

When the electric potential of the T₁ electrode 20 is lower than that of the T₂ electrode 3 and a normal positive signal is given to the gate electrode 1, the junction J₂ is forward biased by the voltage drop due to the first branch current $I_{GT1}$, and electrons are injected from the N₁ layer 11 to the N₃ layer 15 through the P₁ layer 13. The forward bias of the junction between the P₁ layer 13 and the N₃ layer 14 increases and positive holes are injected from the P₁ layer 13 to the N₃ layer 14. When the positive holes reach the P₂ layer 15, electrons are injected from the N₅ layer 17 to the P₂ layer 15. When the injection expands to reach the N₄ layer 16, the TRIAC 70 turns on.

Other operations of the TRIAC 70 would be understood by those skilled in the art from the above description. In any of the operations of the TRIAC 70, as long as the gate signal has a normal value, the resistance area 13a does not give adverse effect to the normal operation of the TRIAC 70. Only a turn on due to a relatively weak and temporary signal such as a displacement current is prevented.

Figure 8:
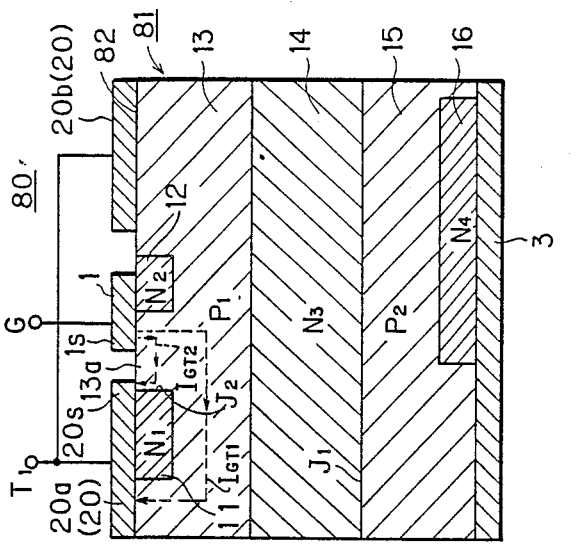
FIG. 8 is a cross sectional view of another embodiment of the present invention.

FIG. 8 is a cross sectional diagram of a TRIAC 80 which is constructed according to another embodiment of the present invention. The TRIAC 80 has a multi-layer semiconductor chip 81. As is apparent by comparing FIG. 5 with FIG. 8, the semiconductor chip 81 has a structure similar to that of the semiconductor chip 71 of FIG. 5. In the semiconductor chip 81, however, the N₅ layer 17 in the semiconductor chip 71 is not provided. The side end 20s of the T₁ electrode 20 and the side end 1s of the gate electrode 1 exist on the P₁ layer 13. The areas A1 through A4 in the embodiment of FIG. 6 are also defined in the embodiment of FIG. 9. The partial surfaces S1 through S3 are also defined in the same manner as the embodiment of FIG. 6. The fourth area A4 in the embodiment of FIG. 8 and FIG. 9 contains only a part of the partial surface S2 and a part of the third area A3.

The T₁ electrode 20 is composed by a first electrode part 20a and a second electrode part 20b. The first electrode part 20a is provided to extend over the first area A1 and the partial surfaces S1 and S2. The second electrode part 20b is provided on the surface S3 which exists on the opposite side of the second area A2 with respect to the third area A3. Mutually adjacent side end 20s of the first electrode part 20a and the side end 1s of the gate electrode 1 are present on the P₁ layer 13. The resistance area 13a which i exposed at the partial surface S3 functions as a resistor interposed between the side ends 20s and 1s. Similarily to the embodiment of FIG. 6, the resistance area 13a is made of a semiconductor material of which the P₁ layer is made. Because the second branch current $I_{GT2}$ flows through the resistance area 13a, the value of the first branch current $I_{GT1}$ which flows by the displacement current is small and the (dv/dt) turn on resistance is improved.

The TRIACs 70 and 80 in which the side ends 20s and 1s exist on the P₁ layer 13 are manufactured by applying a modification to the conventional manufacturing method. As is clear by comparing the conventional TRIACs (shown in FIG. 1 and FIG. 4) with the present TRIACS 70 and 80, the size of the $T_1$ electrode 20 or 20a is made larger than the conventional size so as to cause the side end 20s to exist on the $P_1$ layer 13. The TRIACs 70 and 80 can be manufactured also by reducing the size of $N_1$ layer 11 from the conventional one.

The present invention is also applied to a thyristor (not shown) which has a pnpn junction structure. That is to say, a novel thyristor can be obtained by eliminating the $N_2$ layer 12, $N_4$ layer 16 and $N_5$ layer 17 from the TRIACs 70 and 80.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device of the thyristor type having a pnpn junction comprising:
   (a) a semiconductor chip comprised of
      (a-1) a first semiconductor layer having a first conductive type and having a first surface which includes first and second areas adjacent to each other,
      (a-2) a second semiconductor layer having a second conductive type selectively provided in said first surface of said first semiconductor layer, in which said second semiconductor layer exposes at said second area of said first surface of said first semiconductor layer,
      (a-3) a third semiconductor layer of said second conductive type provided on a second surface of said first semiconductor layer, and
      (a-4) a fourth semiconductor layer of said first conductive type provided on a surface of said third semiconductor layer opposite to the surface of said third semiconductor layer which is provided on the second surface of said first semiconductor layer,
   (b) a control electrode which is selectively provided on said first surface of said first semiconductor layer,
   (c) a first main electrode which is provided on said first surface of said semiconductor layer and which extends over said first surface of said first semiconductor layer and said second area, wherein one side end of said first main electrode and one side end of said control electrode are adjacent to each other with a first area of said first surface of said first semiconductor layer therebetween, and a first part of said first semiconductor layer which is exposed in said first area is served as a resistance area made of a semiconductor material and wherein the conductivity of said resistance area is different from the conductivity of a second part of said first semiconductor layer, which is that part of said first semiconductor layer other than said first part and which is at a location that is in contact with said third semiconductor layer and wherein the conductivity of said resistance area is such that current may flow between said control electrode and said first main electrode through said resistance area, when an electric voltage is applied between said control electrode and said first main electrode, and
   (d) a second main electrode which is provided on a surface of said fourth semiconductor layer opposite to the surface of said fourth semiconductor layer which is provided on said surface of said third semiconductor layer.

2. A semiconductor device according to claim 1, wherein
   said first semiconductor layer is an impurity semiconductor, and
   an impurity density of said resistance area is different from an impurity density in said second part of said first semiconductor layer.

3. A semiconductor device according to claim 2, wherein said semiconductor device is a TRIAC,
   a fifth semiconductor layer having said second conductive type is selectively provided in said first semiconductor layer,
   a sixth semiconductor layer of said second conductive type is selectively provided in said fourth semiconductor layer, said sixth semiconductor layer being exposed on a part of said one surface of said fourth semiconductor layer,
   said fifth semiconductor layer is exposed in a third area of said first surface of said first semiconductor layer, and
   said control electrode is formed on a fourth area of said first surface of said first semiconductor layer, said fourth area containing at least a part of said third area, which is in contact with said first area of said first surface of said semiconductor chip.

4. A semiconductor device according to claim 3, wherein
   said first main electrode has:
   (c-1) a first electrode part which is provided to extend over said second area and said firs surface of said first semiconductor layer, and
   (c-2) a second electrode part provided on a part of said first surface of said first semiconductor layer existing on an opposite side of said second area with respect to said third area.

* * * * *